United States Patent
Azenkot et al.

(10) Patent No.: US 8,155,600 B2
(45) Date of Patent: Apr. 10, 2012

(54) DIGITAL COMMUNICATION USING AN INEXPENSIVE REFERENCE CRYSTAL

(75) Inventors: Yehuda Azenkot, San Jose, CA (US); Manoneet Singh, Philadelphia, PA (US)

(73) Assignee: Texas Instruments Incorporated, Dallas, TX (US)

( * ) Notice: Subject to any disclaimer, the term of this patent is extended or adjusted under 35 U.S.C. 154(b) by 1162 days.

(21) Appl. No.: 11/949,394

(22) Filed: Dec. 3, 2007

(65) Prior Publication Data

US 2009/0141781 A1 Jun. 4, 2009

(51) Int. Cl.
*H04B 1/40* (2006.01)
(52) U.S. Cl. ........................................................ 455/76
(58) Field of Classification Search .................... 455/76, 455/77, 78, 119, 123, 125, 136, 165.1, 71, 455/139, 147, 192.1, 75, 113, 164.1, 183.1, 455/196.1, 258, 259, 264, 208
See application file for complete search history.

(56) References Cited

U.S. PATENT DOCUMENTS

| | | | |
|---|---|---|---|
| 5,170,413 A * | 12/1992 | Hess et al. | 375/260 |
| 5,276,706 A * | 1/1994 | Critchlow | 375/343 |
| 5,887,247 A * | 3/1999 | Baltus et al. | 455/277.2 |
| 6,356,608 B1 * | 3/2002 | Atarius | 375/362 |
| 6,765,977 B1 * | 7/2004 | Adams et al. | 375/376 |
| 6,798,853 B1 * | 9/2004 | Lindbom et al. | 375/344 |
| 6,934,524 B2 * | 8/2005 | Hansen et al. | 455/318 |
| 7,107,085 B2 * | 9/2006 | Doi | 455/575.7 |
| 2002/0123311 A1 * | 9/2002 | Nagayasu | 455/70 |
| 2003/0100283 A1 * | 5/2003 | Wu et al. | 455/258 |
| 2004/0137851 A1 * | 7/2004 | Akhter et al. | 455/71 |
| 2010/0080270 A1 * | 4/2010 | Chen et al. | 375/219 |

* cited by examiner

*Primary Examiner* — Duc Nguyen
*Assistant Examiner* — Mark Woodall
(74) *Attorney, Agent, or Firm* — Steven A. Shaw; W. James Brady; Frederick J. Telecky, Jr.

(57) ABSTRACT

Systems and methods for digital communication using an inexpensive reference crystal are described herein. Some illustrative embodiments include a method that includes setting a center frequency of a local oscillator used by a radio frequency (RF) transceiver, sequentially applying each of a plurality of predetermined offsets to the center frequency of the local oscillator, determining a plurality of metrics indicative of the quality of a received signal (each of the plurality of metrics corresponding to a different predetermined offset of the plurality of predetermined offsets), and selecting a predetermined offset of the plurality of predetermined offsets that results in a metric indicating a received signal that is higher in quality than the received signal that results when applying each of the remaining predetermined offsets of the plurality of offsets.

19 Claims, 5 Drawing Sheets

DIGITAL COMMUNICATION USING AN INEXPENSIVE REFERENCE CRYSTAL

BACKGROUND

As wireless digital communication systems have continued to proliferate, manufacturers of such systems have continued to look for ways to reduce the overall costs of such systems. But a reduction in the cost of a system can sometimes result in a performance penalty, due to the lower quality of less expensive components. One component in particular that can vary significantly in cost and quality is the reference crystal used to generate the clocks for producing transmitted signals and for decoding received signals. The quality of such crystals is sometimes measured as a function of how close the actual frequency generated by the crystal is to the specified frequency. One metric used to quantify the discrepancy in frequency is "parts-per-million" or "PPM," which is a measure of the frequency range, above or below the rated frequency, within which the crystal is guaranteed to operate. Thus, for example, a 1 MHz crystal that is rated at ±100 PPM is guaranteed to operate at no more 1,000,100 Hz, and at no less than 999,900 Hz.

But designers of wireless systems are required to design transmitters and receivers to operate within known tolerances in order for the system to operate reliably. Thus, for example, a system may require that the total combined accuracy of a transmitter and a receiver communicating with each other not exceed ±40 PPM (e.g., in order to guarantee that a phase-locked loop in the receiver can acquire and lock onto the transmitted signal). In this example, if the transmitter has a crystal oscillator with an accuracy of ±20 PPM, then the accuracy of the receivers oscillator also cannot exceed ±20 PPM. To achieve such accuracy, the receiver must either use a crystal rated at ±20 PPM or better, or must use a less accurate crystal with additional circuitry that compensates for the inaccuracy of the crystal. Both solutions add to the cost of the receiver, relative to using a simple, uncompensated oscillator circuit that utilizes a less accurate reference crystal.

SUMMARY

Systems and methods for digital communication using an inexpensive reference crystal are described herein. Some illustrative embodiments include a method that includes setting a center frequency of a local oscillator used by a radio frequency (RF) transceiver, sequentially applying each of a plurality of predetermined offsets to the center frequency of the local oscillator, determining a plurality of metrics indicative of the quality of a received signal (each of the plurality of metrics corresponding to a different predetermined offset of the plurality of predetermined offsets), and selecting a predetermined offset of the plurality of predetermined offsets that results in a metric indicating a received signal that is higher in quality than the received signal that results when applying each of the remaining predetermined offsets of the plurality of offsets.

Other illustrative embodiments include a wireless communication system, that includes a radio frequency (RF) transmitter, an RF receiver, and an RF frequency synthesizer coupled to the RF transmitter and the RF receiver (the RF frequency synthesizer configured to provide to the RF receiver and to the RF transmitter a signal of a selected center frequency). The frequency synthesizer sequentially adjusts the selected center frequency using each of a plurality of predetermined offset values to determine which of the plurality of predetermined offset values results in a highest quality metric of the received signal, as compared to quality metrics of the received signal that result when the selected center frequency is adjusted by each of the remaining plurality of predetermined offset values.

Yet further illustrative embodiments include a computer-readable medium that includes software that causes a processor to set a center frequency of a local oscillator used by a radio frequency (RF) transceiver, sequentially apply each of a plurality of predetermined offsets to the center frequency of the local oscillator, determine a plurality of metrics indicative of the quality of a received signal (each of the plurality of metrics corresponding to a different predetermined offset of the plurality of predetermined offsets), and select a predetermined offset of the plurality of predetermined offsets that results in a metric indicating a received signal that is higher in quality than the received signal that results when applying each of the remaining predetermined offsets of the plurality of offsets.

BRIEF DESCRIPTION OF THE DRAWINGS

For a detailed description of illustrative embodiments of the invention, reference will now be made to the accompanying drawings in which.

NOTATION AND NOMENCLATURE

Certain terms are used throughout the following discussion and claims to refer to particular system components. This document does not intend to distinguish between components that differ in name but not function. In the following discussion and in the claims, the terms "including" and "comprising" are used in an open-ended fashion, and thus should be interpreted to mean "including but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. Additionally, the term "system" refers to a collection of two or more hardware and/or software components and may be used to refer to an electronic device, such as a wireless device, a portion of a wireless device, a combination of wireless devices, etc. Further, the term "software" includes any executable code capable of running on a processor, regardless of the media used to store the software. Thus, code stored in non-volatile memory, and sometimes referred to as "embedded firmware," is included within the definition of software.

DETAILED DESCRIPTION

Figure 1:
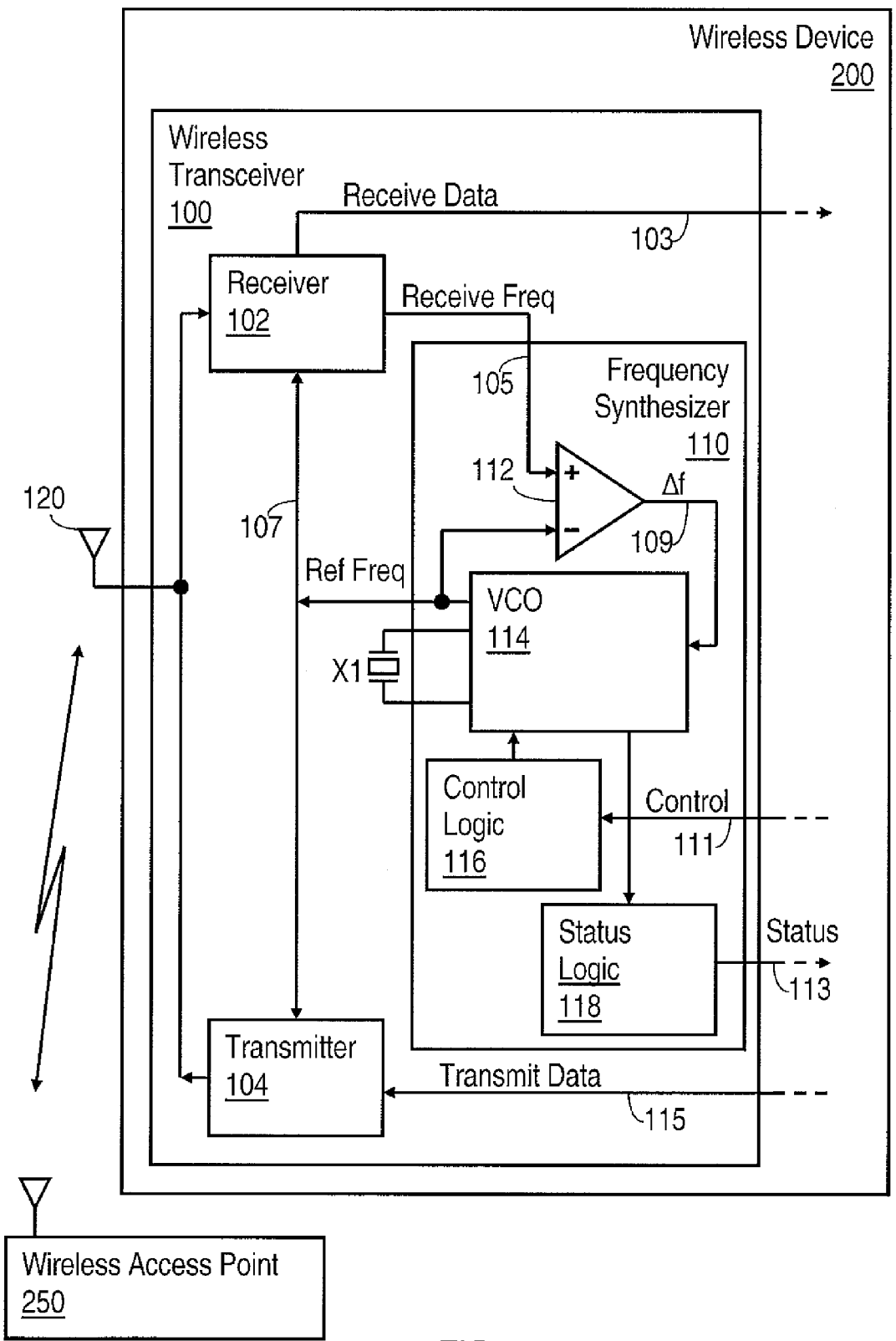
FIG. 1 shows a wireless device that includes a wireless transceiver constructed in accordance with at least some illustrative embodiments.

FIG. 1 shows a wireless access point 250 wirelessly communicating with a wireless device 200, constructed in accordance with at least some illustrative embodiments. Any number of devices may operate as wireless device 200, such as a laptop computer with a wireless network interface, a Wi-Fi® enabled PDA, and a Wi-Fi® enabled cellular telephone, just to name a few examples. The wireless device 200 includes a wireless transceiver 100, which includes a wireless receiver 102 and wireless transmitter 104, both coupled to each other and to antenna 120. Receiver 102 receives wireless radio frequency (RF) signals, via antenna 120, from an external wireless host or network access point (e.g., from wireless access point 250). Receiver 102 generates received data signal 103 by combining reference frequency signal 107 and the received signals. Similarly, transmitter 104 generates and transmits wireless RF signals to wireless access point 250, via antenna 120, by combining reference frequency signal 107 and transmit data signal 115.

Wireless transceiver 100 further includes frequency synthesizer 110, which couples to both receiver 102 and transmitter 104, and includes differential amplifier 112, voltage-controlled oscillator (VCO) 114, reference crystal X1, control logic 116, and status logic 118. The two input nodes of differential amplifier 112 are respectively coupled to an output node of receiver 102 that provides receive frequency signal 105, and an output node of VCO 114 that provides reference frequency signal 107. The output node of differential amplifier 112 couples to an input control node of VCO 114 and provides the frequency difference ($\Delta f$) control signal used to adjust the base center frequency of VCO 114 (i.e., the base center frequency of reference frequency signal 107). The base RF center frequency is determined by reference crystal X1, which also couples to VCO 114. The center frequency at which crystal X1 operates is divided and/or multiplied by logic within VCO 114, causing VCO 114 to generate reference frequency signal 107 at a desired center frequency.

Control logic 116 couples to VCO 114 and controls the configuration of VCO 114 that determines the center frequency of the VCO. One or more control signals 111 are sent to control logic 116, and operate to control the center frequency of VCO 114, and thus of frequency synthesizer 110. The overall center frequency is determined by a combination of the programmed center frequency (based upon the known, specified frequency of crystal X1), adjustments that result from frequency differences detected by differential amplifier 112, and frequency offset values used to adjust the programmed center frequency, in accordance with at least some illustrative embodiments as described below. Status logic 118 also couples to VCO 114 and permits status information regarding VCO 114 and frequency synthesizer 110 (via one or more status signals 113) to be provided to components external to frequency synthesizer 110. Control signals 111 and status signals 113 may, for example, be respectively sent and received by processing logic within a laptop computer that utilizes wireless transceiver 100 as part of a wireless network interface, as shown in the illustrative embodiment of FIG. 1.

Figure 2A:
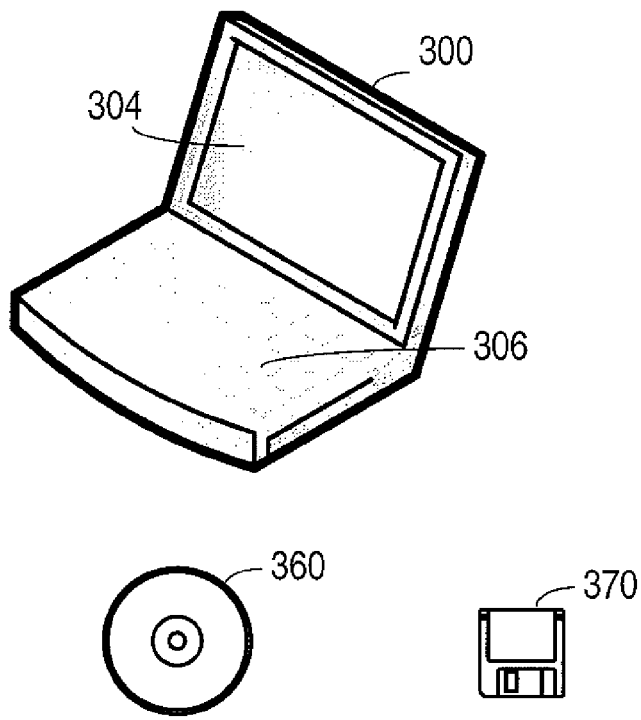
FIG. 2A shows an example of a system configuration, suitable for use as the wireless device of FIG. 1, in accordance with at least some illustrative embodiments.
Figure 2B:
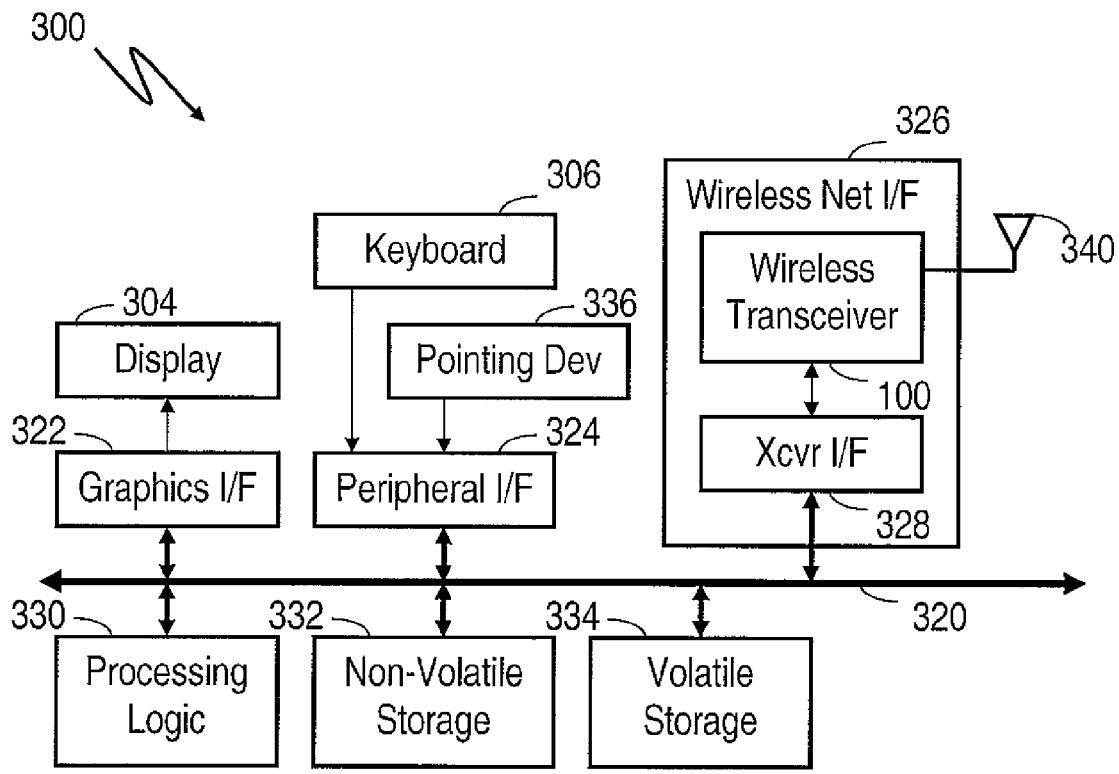
FIG. 2B shows a block diagram of the system configuration of 2A, in accordance with at least some illustrative embodiments.

FIGS. 2A and 2B show an illustrative system configuration 300 suitable for implementing wireless device 200 of FIG. 1. As shown in FIG. 2A, the illustrative system configuration 300 includes a display 304 and an input device (e.g., a keyboard) 306. The system configuration 300, as shown in FIG. 2B, further includes processing logic 330 (e.g., a microprocessor), non-volatile storage 332, and volatile storage 334. Non-volatile storage 332 includes a computer-readable medium such as a flash random access memory (flash RAM), a read-only memory (ROM), a hard disk drive, a floppy disk (e.g., floppy 370), a compact disk read-only memory (CD-ROM, e.g., CD-ROM 360), as well as combinations of some and/or all such medium. Volatile storage 334 includes a computer-readable medium such as random access memory (RAM).

The computer-readable media of both non-volatile storage 332 and volatile storage 334 include, for example, software that is executed by processing logic 330 and, in at least some illustrative embodiment, provides wireless device 200 with at least some of the functionality described herein. The system configuration 300 also includes a wireless network interface (Wireless Net I/F) 326 that enables the system configuration 300 to transmit information to, and receive information from, a local area network (LAN) and/or a wide area network (WAN) via a wireless interface to the network (e.g., wireless access point 250 of FIG. 1). Wireless network interface 326 includes wireless transceiver 100 (which couples to RF antenna 340), and transceiver interface (Xcvr I/F) 328 (which couples to wireless transceiver 100 and bus 320). A graphics interface (Graphics I/F) 322 couples to the display 304. A user interacts with the processing system via an input device such as keyboard 306 and/or pointing device (Pointing Dev) 336 (e.g., a mouse), which both couple to a peripheral interface (Peripheral I/F) 324. The display 304, keyboard 306 and pointing device 336 together may operate as a user interface.

System configuration 300 may be a bus-based computer, with the bus 320 interconnecting the various elements shown in FIG. 2B. The peripheral interface 324 accepts signals from the keyboard 306 and other input devices such as pointing device 336, and transforms the signals into a form suitable for communication on bus 320. The graphics interface 322 may include a video card or other suitable display interface that accepts information from the bus 320 and transforms it into a form suitable for the display 304. Similarly, transceiver interface 328 accepts signals from wireless transceiver 100 and transforms them into a form suitable for communication on bus 320, and further accepts information from bus 320 and transforms it into a form suitable for wireless transceiver 100.

Processing logic 330 gathers information from other system elements, including input data from the peripheral interface 324, and program instructions and other data from non-volatile storage 332 or volatile storage 334, or from other systems (e.g., a server used to store and distribute copies of executable code) coupled to a local area network or a wide area network via the wireless network interface 326. Processing logic 330 executes the program instructions and processes the data accordingly. The program instructions may further configure processing logic 330 to send data to other system elements, such as information presented to the user via the graphics interface 322 and display 304. The wireless network interface 326 enables processing logic 330 to communicate with other systems via a network. Volatile storage 334 may serve as a low-latency temporary store of information for processing logic 330, and non-volatile storage 332 may serve as a long-term (but higher latency) store of information.

Processing logic 330, and hence the system configuration 300 as a whole, operates in accordance with one or more programs stored on non-volatile storage 332 or received via wireless network interface 326. Processing logic 330 may copy portions of the programs into volatile storage 334 for faster access, and may switch between programs or carry out additional programs in response to user actuation of the input devices. The additional programs may be retrieved or received from other locations via wireless network interface 326. One or more of these programs executes on system configuration 300, causing the configuration, in at least some illustrative embodiments, to perform at least some of the functions of wireless device 200 as disclosed herein.

As previously noted, in at least some illustrative embodiments, such as that of FIG. 1, control logic accepts both a base center frequency configuration and an offset value that adjusts the base center frequency. The base center frequency configuration is based upon the known, specified frequency of a reference crystal, but may be further adjusted with an offset value to compensate for inaccuracies of the reference crystal that exceed the tolerances required of the overall wireless transceiver. Referring again to the illustrative embodiment of FIG. 1, if, for example, wireless transceiver 100 and wireless access point 250 are required to differ in frequency by no more than plus or minus forty parts per million (±40 PPM), VCO 114 will not be able to acquire and lock onto (i.e., "capture") a received signal that differs from the operating frequency of the VCO by more than 40 PPM. If wireless access point 250 is designed, for example, to operate with an accuracy of ±20 PPM, then the center frequency of VCO 114 must be within ±20 PPM of the expected center frequency (for a combined accuracy of ±40 PPM) in order for the VCO to capture the received signal (also sometimes referred to as the "capture range" and shown in FIG. 3).

Figure 3:
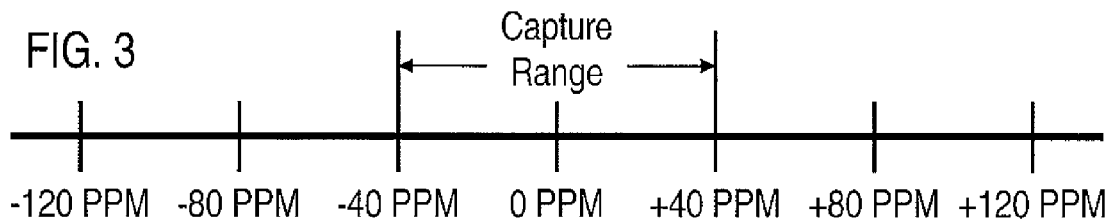
FIG. 3 shows an example of the capture range of a transmitter/receiver pair, in accordance with at least some illustrative embodiments.

In at least some illustrative embodiments, a reference crystal is used with a tolerance that well outside the tolerance required by the VCO. For example, in a system that requires a capture range of ±40 PPM and which uses a wireless access point operating with an accuracy of ±20 PPM, a reference crystal is used within frequency synthesizer 110 of FIG. 1 that produces a reference frequency signal with an accuracy of ±100 PPM. This results in a combined accuracy of ±120 PPM, well outside the ±40 PPM capture range of the VCO, as shown in FIG. 3. In order to compensate for crystal inaccuracies that produce such an out-of-tolerance reference frequency signal, a series of frequency offset values are sequentially used to adjust the base operating frequency of the VCO until an offset value is identified that results in a base center frequency that differs from the center frequency of the received signal by less than the capture range. In the example described, with an overall tolerance of ±120 PPM, offset values of −80 PPM, 0 PPM and +80 PPM, each sequentially applied to the VCO, will result in a reference frequency signal that is within the ±40 PPM requirement for at least one of the three offset values. This is equivalent to taking the total tolerance range (here 240 PPM) and dividing it by an incremental value (here set to the total capture range of 80 PPM) to determine the number of ranges (3) needed. This can alternatively be expressed as:

$$Acc_{RcvSig} + Acc_{LclOsc} \leq N * \text{Increment} \quad (1)$$

where $Acc_{RcvSig}$ is the accuracy of the received signal;
$Acc_{LclOsc}$ is the accuracy of the local oscillator;
N is the number of intervals; and
Increment=the difference between successive offset values.

Stated slightly differently, each frequency offset value differs from at least one other predetermined frequency offset value by the increment value, wherein the number of frequency offset values multiplied by increment value equals or exceeds the sum of the accuracies of the received signal and the local oscillator.

Figure 4A:
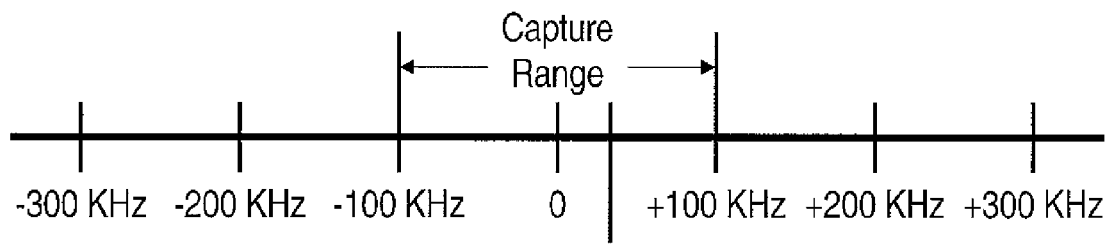
FIGS. 4A through 4C show an example of how frequency offsets are used to compensate for the inaccuracy of a crystal, in accordance with at least some illustrative embodiments.

FIG. 4A shows an example wherein an offset of 0 PPM permits the VCO to capture the received signal, in accordance with at least some illustrative embodiments. In the example shown, the desired reference frequency is 2.5 GHz, which results in 1 PPM being equal to a frequency offset value of 2.5 KHz. Continuing to refer to both FIGS. 1 and 4A, the signal received by receiver 102 from wireless access point 250 differs from the desired center frequency of 2.5 GHz by +5 PPM (+12.5 KHz), while the local oscillator (VCO 114) differs from the desired center frequency by −9 PPM (−22.5 KHz). The result is that the overall frequency difference (Δf) between the received signal and the local oscillator is 35 KHz (14 PPM), which is well within the capture range of ±40 PPM, as shown in FIG. 4A. VCO 114 can capture the received signal described, and wireless transceiver 100 can provide receive data to, and send transmit data from, wireless device 200.

Figure 4B:
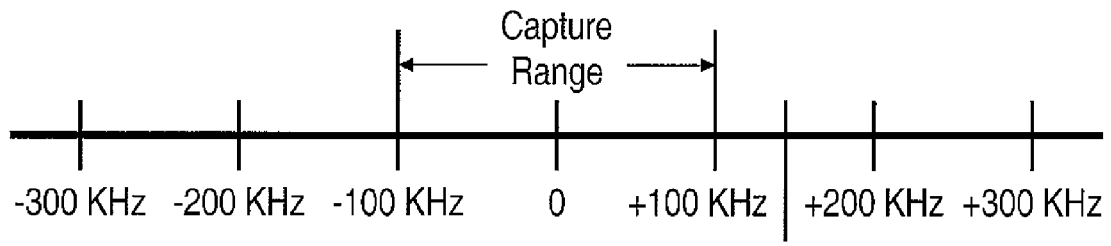

FIG. 4B shows an example wherein an offset of 0 PPM does not permit the VCO to capture the received signal. Referring to both FIGS. 3 and 4B, the signal received by receiver 102 from wireless access point 250 differs from the desired center frequency by +5 PPM (+12.5 KHz), while the local oscillator (VCO 114) differs from the desired center frequency by −53 PPM (−132.5 KHz). The result is that the overall frequency different (Δf) between the received signal and the local oscillator is 145 KHz (58 PPM), which is well outside of the capture range of ±40 PPM, as shown in FIG. 4B. Wireless transceiver 100 is being presented with a signal that is 145 KHz higher than the reference frequency signal generated within the transceiver, and 45 KHz above the upper bounds of the capture range of VCO 114. Thus, the transceiver cannot receive and decode the data from the signal transmitted by wireless access point 250, and cannot transmit data to wireless access point 250 at a frequency that is within the specified tolerance (±40 PPM) in order to be received and decoded by the wireless access point.

Figure 4C:
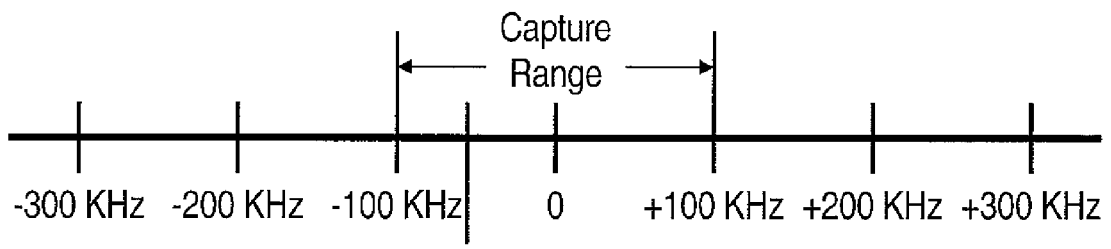

FIG. 4C shows the results of adding a +80 PPM (200 KHz) offset to the base center frequency of the local oscillator (VCO 114), in accordance with at least some illustrative embodiments. The addition of the offset value causes VCO 114 to operate at a center frequency that is 67.5 KHz (27 PPM) above the desired center frequency of 2.5 GHz. The result is that the overall frequency different (Δf) between the received signal and the local oscillator after the offset adjustment is −55 KHz (−22 PPM), which is well within the capture range of VCO 114, as shown in FIG. 4C. Thus, the application of the offset value to the base frequency of the VCO effectively re-maps signals that are offset from the VCO center frequency by between +40 PPM and +120 PPM to a range of signals that are offset from the VCO center frequency by between −40 PPM and +40 PPM, which is the capture range of the VCO. The application of an offset value of −80 PPM similarly re-maps signals with offsets between −120 PPM and −40 PPM to within the capture range of the VCO.

Figure 5:
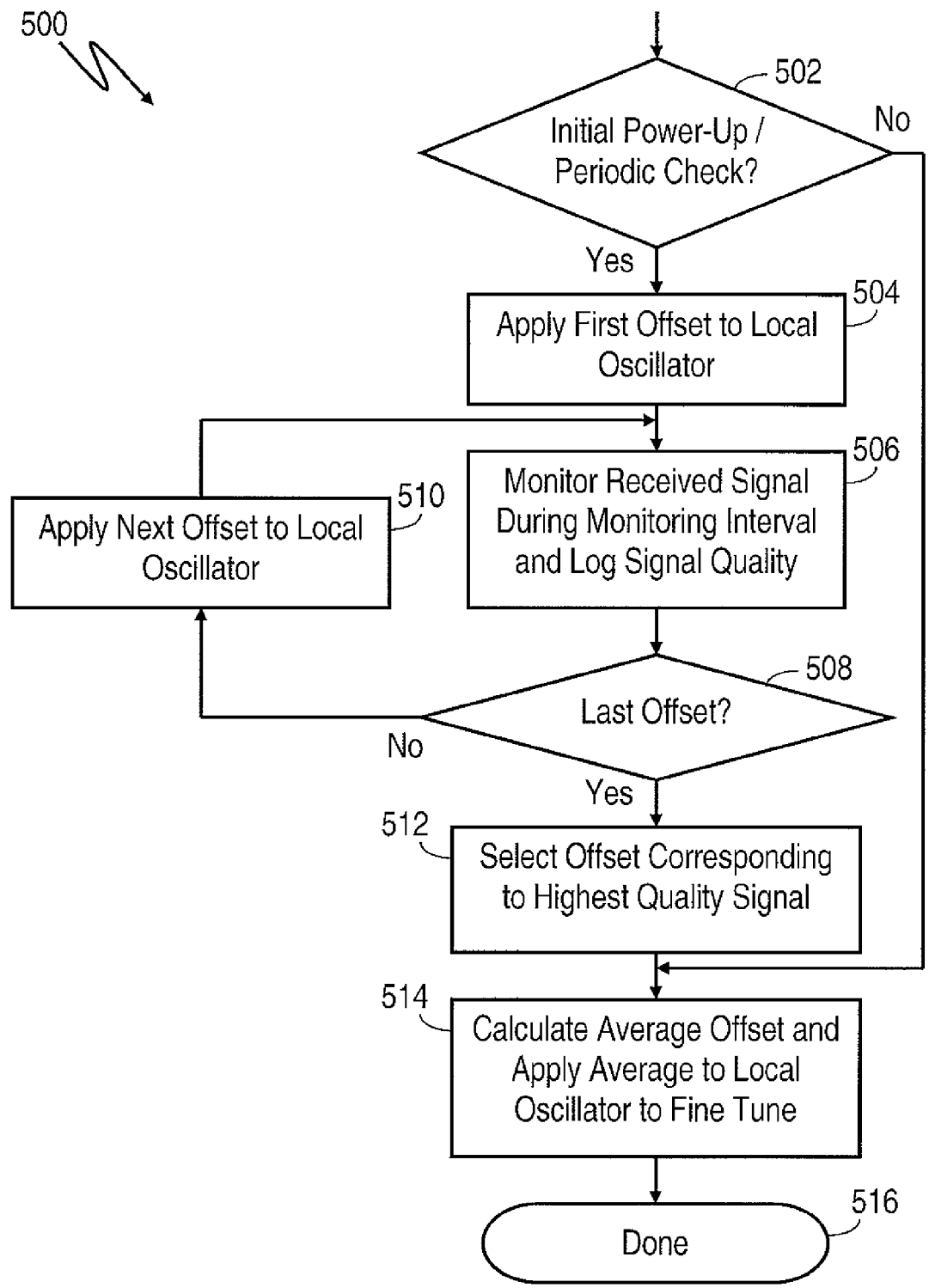
FIG. 5 shows a method for selecting one of a group of sequentially tested frequency offsets, in accordance with at least some illustrative embodiments.

As previously noted, sequentially applying each of several offset values, which together cover a combined tolerance range, results in determining at least one offset value that allows wireless transceiver 100 to communicate with wireless access point 250. FIG. 5 shows a method 500 for sequentially applying a group of offset values to identify and select an offset value of the group, in accordance with at least some illustrative embodiments. The method begins by determining if the system implementing the method has just been powered-up/reset, or if a periodic re-execution of the method is required (block 502). In at least some illustrative embodiments, a transmission cannot be sent by the system until a message has been received, allowing the local oscillator (e.g., VCO 114 of FIG. 1) to operate within the tolerance required to communicate with another device (e.g., wireless access point 250 of FIG. 1). Once adjusted, the system can periodically re-execute the method and re-select the offset to account for drifts over time (e.g., a temperature drift of the local oscillator).

Continuing to refer to FIG. 5, if either a power-up/reset has been detected or a periodic check is scheduled (block 502) the first frequency offset of a group of frequency offset values is applied to the local oscillator (block 504). The frequency offset value is applied by adding the frequency offset value to the desired frequency value, and converting the resulting value into configuration settings that are applied to a frequency synthesizer, such as frequency synthesizer 110 of the illustrative embodiment of FIG. 1, thus adjusting the center frequency of a local oscillator such as VCO 114 of FIG. 1. The received signal is monitored for a short monitoring interval (e.g., for a few milliseconds, or until a small number of frames have been received) and the quality of the signal associated with the applied frequency offset value is logged (block 506). The quality of the signal may be determined, for example, based upon the stability of the local oscillator (e.g., is the local oscillator maintaining lock over the monitoring interval), by monitoring the error rate of the data (e.g., errors detected using cyclic redundancy checks), or by monitoring the level of data synchronization using header frame synchronization fields. Other techniques for determining the quality of the received signal will become apparent to those of ordinary skill in the art, and all such techniques are within the scope of the present disclosure.

Upon reaching the end of the monitoring interval, and if the currently applied offset is not the last frequency offset value of the group or sequence (block 508), the next frequency offset value of the group is applied to the local oscillator (block 510), and the monitoring and logging of block 506 is repeated. Upon reaching the last frequency offset value of the group (block 508), the frequency offset value that results in the highest quality signal is selected and used to adjust the desired center frequency of the local oscillator (block 512). The determination of the highest quality signal may be based on any of the metrics previously listed, and may include determining which offsets enabled the oscillator to lock at all, which offsets resulted in the lowest loss-of-lock rate, which offsets resulted in the fastest signal acquisition, which offsets resulted in the lowest data loss, and which offsets resulted in the lowest data error, just to name a few examples. Other criteria for determining and comparing the quality of a signal that results form the application of one or more frequency offset values will become apparent to those of ordinary skill in the art, and all such criteria are within the scope of the present disclosure.

Upon selection of a frequency offset value (block 512), or upon determining that a power-up/reset or periodic check interval signal has not been detected (block 502), the current difference between the center frequency of the received signal and the center frequency of the local oscillator is measured and used to calculate an average frequency offset value (e.g., a running average value using the last 10 iterations through method 500), which is applied to the local oscillator (e.g., using the negative of the average value or subtracting the average value from the adjusted center frequency) and thus operates to fine tune the center frequency of the local oscillator with respect to the received signal (block 514). The method ends after the average is calculated and applied (block 516).

As previously noted, the wireless transceiver of at least some of the illustrative embodiments described cannot transmit data until after receiving a signal from another device (e.g., wireless access point 250 of FIG. 1), in order to adjust the local oscillator of the wireless transceiver to within the tolerances required to establish a communication link. In other illustrative embodiments, an offline calibrated frequency offset value is stored within the wireless transceiver (e.g., within a non-volatile memory or register within control logic 116), and used to provide an initial offset value to compensate for the inaccuracy of a reference crystal (e.g., crystal X1 of FIG. 1). The offline calibrated frequency offset value is determined and stored during factory testing of the wireless transceiver, and permits the wireless transceiver to operate within the required tolerances and to transmit data without first receiving a signal from an outside source. Once the wireless transceiver begins receiving data, the offline calibrated frequency offset value may be ignored, re-calculated, or adjusted and re-saved, based upon the offset values determined and measured by the illustrative methods described herein. The value used to replace and/or adjust the offline calibrated frequency offset value may be any of the fixed offset values, the average fine tuned offset values, or combinations of the various frequency offset values.

Figure 6:
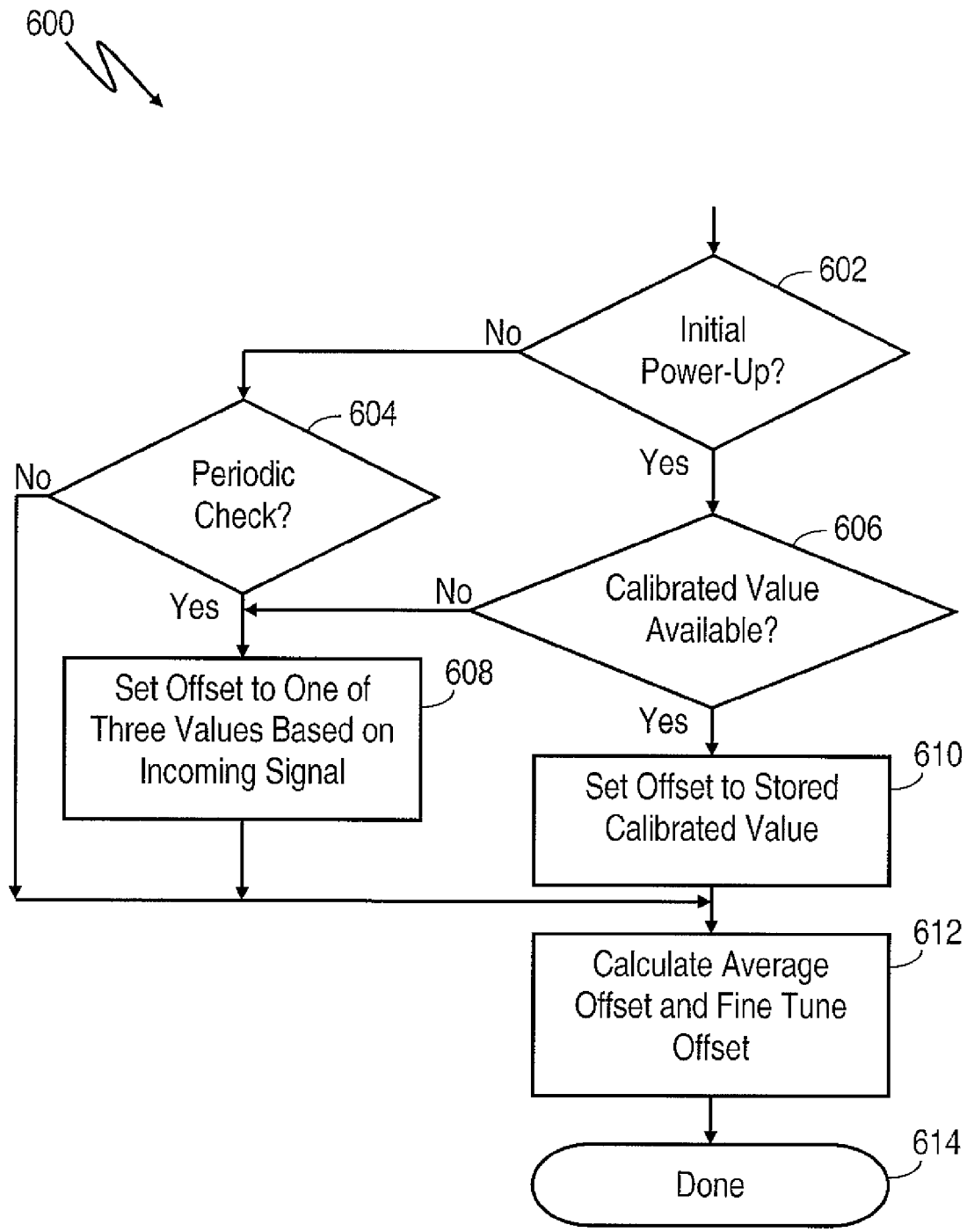
FIG. 6 shows a method for using a stored, offline, calibrated frequency offset value at power-up, in accordance with at least some illustrative embodiments.

FIG. 6 shows a method 600 for using an offline calibrated frequency offset value at power-up, in accordance with at least some illustrative embodiments. If the system that includes the wireless transceiver has just been powered-up and/or reset (block 602), and an offline calibrated frequency offset value is available and/or use of the calibrated value is enabled (block 606), the stored offset value is set as the frequency offset value used to adjust the base center frequency of the local oscillator (block 610). The average frequency offset value is calculated and used to fine tune the offset applied to the local oscillator (block 612), completing the method (block 614). If the system has just been powered-up/reset (block 602), but an offline calibrated frequency offset value is not available and/or use of the calibrated value is disabled (block 606), the frequency offset used to adjust the base center frequency of the local oscillator is selected using a method similar to method 500 (block 608). The average frequency offset value is calculated and used to fine tune the frequency offset value applied to the local oscillator (block 612), completing the method (block 614).

If the system has not just been powered-up (block 602), and a periodic check of the offset values is scheduled (block 604), a method similar to method 500 is performed to select the offset frequency value (block 608), and the average offset value is calculated and used to fine tune the frequency offset value applied to the local oscillator (block 612), completing the method (block 614). If the system has not just been powered-up (block 602), and a periodic check of the offset values is not scheduled (block 604), the current frequency offset selection is not changed. The average frequency offset value is calculated and used to fine tune the current frequency offset value applied to the local oscillator (block 612), completing the method (block 614).

The above disclosure is meant to be illustrative of the principles and various embodiments of the present invention. Numerous variations and modifications will become apparent to those skilled in the art once the above disclosure is fully appreciated. For example, although some of the illustrative embodiments are described within the context of a wireless transceiver that is controlled by processing logic external to the transceiver, other illustrative embodiments may include wireless transceivers with integral processing logic that controls the selection and application of frequency offsets. Further, although the illustrative embodiments described include Wi-Fi® wireless technology, other illustrative embodiments may include a wide variety of technologies, such as, for example, Bluetooth® and Ultra Wide Band (UWB) communication technologies. Also, although specific tolerances and PPM values were provided in the embodiments described, these were given only as examples, and those of ordinary skill in the art will recognize that other illustrative embodiments may include a wide variety of crystal and VCO tolerances, as well as a wide variety of different numbers and combinations of frequency offsets. It is intended that the following claims be interpreted to embrace all such variations and modifications.

What is claimed is:

1. A method, comprising:
setting a center frequency of a local oscillator used by a radio frequency (RF) transceiver;
sequentially applying each of a plurality of predetermined offsets to the center frequency of the local oscillator;
determining a plurality of metrics indicative of the quality of a received signal, each of the plurality of metrics corresponding to a different predetermined offset of the plurality of predetermined offsets; and
determining each predetermined offset of the plurality of predetermined offsets such that each predetermined offset value differs from at least one other predetermined offset value by an increment value, wherein the number of predetermined offsets multiplied by the increment value equals the sum of the accuracy of the received signal and the accuracy of the local oscillator;
selecting a predetermined offset of the plurality of predetermined offsets that results in a metric indicating a received signal that is higher in quality than the received signal that results when applying each of the remaining predetermined offsets of the plurality of offsets.

2. The method of claim 1, wherein determining the plurality of metrics comprises determining an error rate of the received signal for each of the plurality of predetermined offsets.

3. The method of claim 1, wherein the sequentially applying each of the plurality of predetermined offsets, the determining of the plurality of metrics, and the selecting of a predetermined offset of the plurality of predetermined offsets are performed upon initial power-up of the RF transceiver.

4. The method of claim 1, wherein the sequentially applying each of the plurality of predetermined offsets, the determining of the plurality of metrics and the selecting a predetermined offset of the plurality of predetermined offsets are performed at periodic time intervals.

5. The method of claim 1, further comprising:
periodically storing one of a plurality of measured offset values, each measure offset value indicative of the difference between the center frequency of the received signal and the center frequency of the local oscillator;
calculating an average measured offset value of the plurality of measured offset values; and
adjusting the center frequency of the local oscillator by the negative of the average measured offset value.

6. The method of claim 1, further comprising using the local oscillator to produce a transmitted signal from the RF transceiver.

7. The method of claim 1, further comprising:
determining if a calibrated offset value is available for use by the RF transceiver;
performing the sequentially applying of each of the plurality of predetermined offsets, the determining of the plurality of metrics and the selecting of a predetermined offset of the plurality of predetermined offsets if the calibrated offset value is not available; and
applying the calibrated offset value to the center frequency of the oscillator if the calibrated offset value is available.

8. The method of claim 7, wherein the determining of whether the calibrated offset value is available is performed upon initial power-up of the RF transceiver.

9. A wireless communication system, comprising:
a radio frequency (RF) transmitter;
an RF receiver;
an RF frequency synthesizer coupled to the RF transmitter and the RF receiver, the RF frequency synthesizer configured to provide to the RF receiver and to the RF transmitter a signal of a selected center frequency;
wherein the frequency synthesizer sequentially adjusts the selected center frequency using each of a plurality of predetermined offset values to determine which of the plurality of predetermined offset values results in a highest quality metric of the received signal, as compared to quality metrics of the received signal that result when the selected center frequency is adjusted by each of the remaining plurality of predetermined offset values;
a voltage-controlled oscillator (VCO) that generates the signal provided to the RF receiver and the RF transmitter;
a reference crystal, coupled to the VCO, that provides a reference frequency signal to the VCO;
control logic coupled to the VCO, the control logic operates to set the selected center frequency based upon the reference frequency signal, and further operates to adjust the selected center frequency by at least one of the plurality of predetermined offset values; and
a differential amplifier, a first input node of the differential amplifier coupled to the output node of the VCO, a second input node of the differential amplifier coupled to an output node of the receiver, and an output node of the differential amplifier coupled to a control node of the VCO, the differential amplifier operates to adjust the selected center frequency,
determining each predetermined offset of the plurality of predetermined offsets such that each predetermined offset value differs from at least one other predetermined offset value by an increment value, wherein the number of predetermined offsets multiplied by the increment value equals the sum of the accuracy of the received signal and the accuracy of the VCO.

10. The wireless communication system of claim 9, wherein the received signal comprises data, and wherein the quality metric of the received signal is inversely proportional to the error rate of the data.

11. The wireless communication system of claim 9, further comprising status logic configured to provide a current offset value that represents the difference between the selected center frequency, adjusted by at least one of the plurality of predetermined offset values, and the received signal center frequency; wherein the control logic further adjusts the selected center frequency based upon an average of a plurality of samples of the current offset value.

12. The wireless communication system of claim 9, further comprising:
a memory storage device comprising a calibrated offset value;
wherein the frequency synthesizer uses at least one of the plurality of predetermined offset values to adjust the selected center frequency if use of the calibrated offset value is disabled; and
wherein the frequency synthesizer uses the calibrated offset value to adjust the selected center frequency if use of the calibrated offset value is enabled.

13. A non-volatile/non-transitory computer-readable medium comprising software that causes a processor to:
- set a center frequency of a local oscillator used by a radio frequency (RF) transceiver;
- sequentially apply each of a plurality of predetermined offsets to the center frequency of the local oscillator;
- determine a plurality of metrics indicative of the quality of a received signal, each of the plurality of metrics corresponding to a different predetermined offset of the plurality of predetermined offsets;
- determine each predetermined offset of the plurality of predetermined offsets such that each predetermined offset value differs from at least one other predetermined offset value by an increment value, wherein the number of predetermined offsets multiplied by the increment value equals the sum of the accuracy of the received signal and the accuracy of the local oscillator; and
- select a predetermined offset of the plurality of predetermined offsets that results in a metric indicating a received signal that is higher in quality than the received signal that results when applying each of the remaining predetermined offsets of the plurality of offsets.

14. The non-volatile/non-transitory computer-readable medium of claim 13, wherein the software causing the processor to determine the plurality of metrics comprises causing the processor to determine an error rate of the received signal for each of the plurality of predetermined offsets.

15. The non-volatile/non-transitory computer-readable medium of claim 13, wherein the software causes the processor to sequentially apply each of the plurality of predetermined offsets, to determine the plurality of metrics, and to select a predetermined offset of the plurality of predetermined offsets upon initial power-up of the RF transceiver.

16. The non-volatile/non-transitory computer-readable medium of claim 13, wherein the software causes the processor to sequentially apply each of the plurality of predetermined offsets, to determine the plurality of metrics, and to select a predetermined offset of the plurality of predetermined offsets at periodic time intervals.

17. The non-volatile/non-transitory computer-readable medium of claim 13, wherein the software further causes the processor to:
- periodically store one of a plurality of measured offset values, each measure offset value indicative of the difference between the center frequency of the received signal and the center frequency of the local oscillator;
- calculate an average measured offset value of the plurality of measured offset values; and
- adjust the center frequency of the local oscillator by the negative of the average measured offset value.

18. The non-volatile/non-transitory computer-readable medium of claim 13, wherein the software further causes the processor to:
- determine if a calibrated offset value is available for use by the RF transceiver;
- sequentially apply of each of the plurality of predetermined offsets, determine the plurality of metrics, and select a predetermined offset of the plurality of predetermined offsets if the calibrated offset value is not available; and
- apply the calibrated offset value to the center frequency of the oscillator if the calibrated offset value is available.

19. The non-volatile/non-transitory computer-readable medium of claim 18, wherein the software causes the processor to determine whether the calibrated offset value is available upon initial power-up of the RF transceiver.

* * * * *